(12) United States Patent
Chen et al.

(10) Patent No.: US 11,230,098 B2
(45) Date of Patent: Jan. 25, 2022

(54) PASSIVATION STACKS

(71) Applicant: HEWLETT-PACKARD DEVELOPMENT COMPANY, L.P., Spring, TX (US)

(72) Inventors: Zhizhang Chen, Corvallis, OR (US); Lawrence H. White, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/603,581

(22) PCT Filed: May 11, 2018

(86) PCT No.: PCT/US2018/032233
§ 371 (c)(1),
(2) Date: Oct. 7, 2019

(87) PCT Pub. No.: WO2019/216907
PCT Pub. Date: Nov. 14, 2019

(65) Prior Publication Data

US 2021/0331471 A1   Oct. 28, 2021

(51) Int. Cl.
*B41J 2/14* (2006.01)
*B41J 2/16* (2006.01)
*C23C 16/455* (2006.01)
*C23C 16/40* (2006.01)

(52) U.S. Cl.
CPC ......... *B41J 2/14129* (2013.01); *B41J 2/1601* (2013.01); *B41J 2/1642* (2013.01); *C23C 16/402* (2013.01); *C23C 16/405* (2013.01); *C23C 16/45525* (2013.01)

(58) Field of Classification Search
CPC .... B41J 2/14129; B41J 2/1601; B41J 2/1642; C23C 16/402; C23C 16/405; C23C 16/45525
See application file for complete search history.

(56) References Cited

U.S. PATENT DOCUMENTS

| | | | |
|---|---|---|---|
| 4,567,493 | A | 1/1986 | Ikeda et al. |
| 6,982,230 | B2 | 1/2006 | Cabral et al. |
| 7,759,748 | B2 | 7/2010 | Yu et al. |
| 9,511,585 | B2 | 12/2016 | Abbott et al. |
| 2004/0091612 | A1 | 5/2004 | Bernard et al. |
| 2007/0218623 | A1 | 9/2007 | Chua et al. |
| 2010/0323509 | A1* | 12/2010 | Shin ................ H01L 29/42332 438/591 |

(Continued)

FOREIGN PATENT DOCUMENTS

WO   WO2018013093 A1   1/2018

*Primary Examiner* — Yaovi M Ameh
(74) *Attorney, Agent, or Firm* — Thorpe North & Western LLP

(57) ABSTRACT

A passivation stack can include a laminated film, including from 8 to 40 alternating layers of $HfO_2$ and $SiO_2$. The layers can individually have a thickness from 8 Angstroms to 40 Angstroms, and the laminated film can have a total thickness of 280 Angstroms to 600 Angstroms. The passivation stack can also include a barrier film of $HfO_2$ having a thickness from 50 Angstroms to 300 Angstroms applied to the laminated film.

15 Claims, 3 Drawing Sheets

(56) References Cited

U.S. PATENT DOCUMENTS

| | | | |
|---|---|---|---|
| 2013/0063525 A1* | 3/2013 | Sieber | B41J 2/1606 347/45 |
| 2014/0285580 A1 | 9/2014 | Seki et al. | |
| 2016/0336178 A1 | 11/2016 | Swaminathan et al. | |
| 2017/0043600 A1 | 2/2017 | Abbott | |
| 2017/0066684 A1 | 3/2017 | Oudard et al. | |
| 2019/0152226 A1* | 5/2019 | Chen | B41J 2/162 |

* cited by examiner

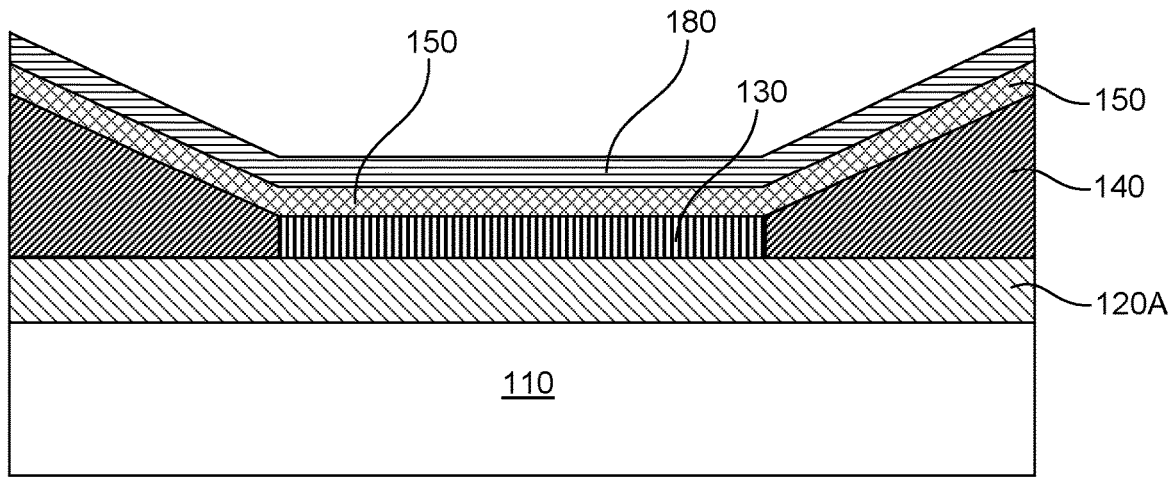

| building up a laminated film on a resistor using Atomic Layer Deposition, wherein the laminated film includes from 8 to 40 alternating layers of HfO$_2$ and SiO$_2$ with individual layers having a thickness from 8 Angstroms to 40 Angstroms, and wherein the laminated film has a total thickness of 280 Angstroms to 600 Angstroms | ──210 |

| applying a barrier film of HfO$_2$ having a thickness from 50 Angstroms to 300 Angstroms to the laminated film | ──220 |

FIG. 4

PASSIVATION STACKS

BACKGROUND

Fluidic dies, such as inkjet printheads can be used for various purposes. In the case of printheads, the fluidic die can be used to eject ink or other fluids from a firing chamber through a printing orifice. For example, a firing resistor can be used to thermally generate bubbles suitable to rapidly displace fluid within the firing chamber for ejection of the fluid through the printing orifice. The resistor and other components used for this can be isolated from the fluid that may be present in the firing chamber using any of a number of types of protective layers of material. The firing of ink from a firing chamber can be repeated thousands of times per second in some instances, which can have a deleterious effect on the protective layer and/or other layers.

BRIEF DESCRIPTION OF THE DRAWINGS

FIG. 3 depicts a portion of an example fluidic die with a passivation stack prepared in accordance with the present disclosure;

FIG. 4 is a flow diagram depicting an example method of manufacturing a fluidic die in accordance with the present disclosure.

DETAILED DESCRIPTION

Figure 1:
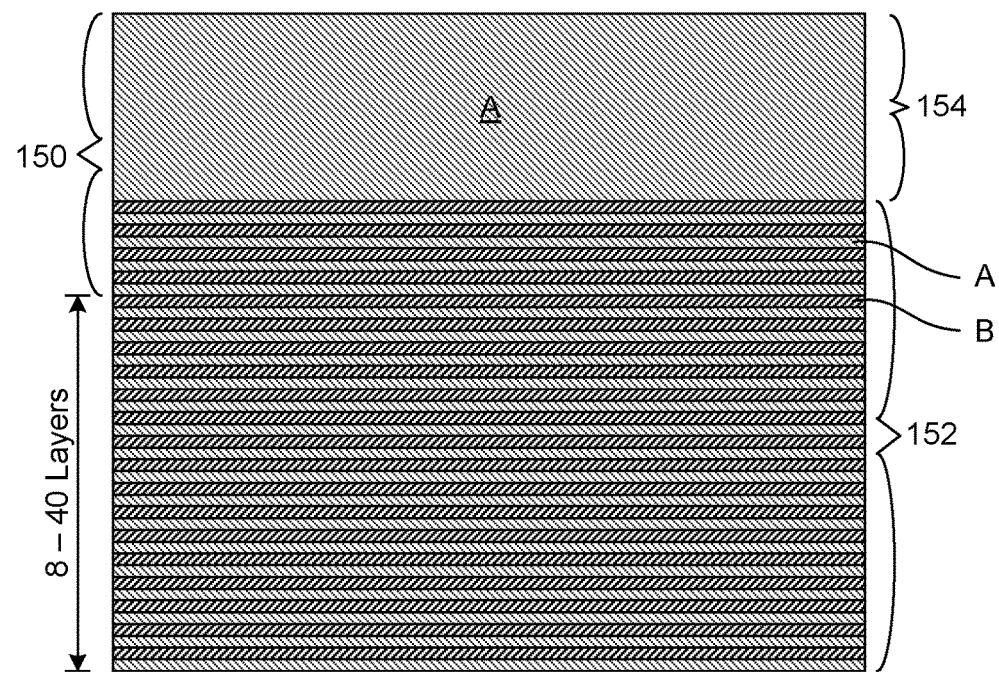
FIG. 1 depicts an example passivation stack prepared in accordance with the present disclosure.

Layered semiconductor devices, such as fluidic dies, can be part of devices that can be subjected to various physical, chemical, mechanical, and/or electrical stresses, e.g. heat, voltage, corrosion, physical stress, etc. One example of a fluidic die is a printhead. Fluidic dies can also be used in lab-on-a-chip devices, precision dispensing devices, etc. With fluidic dies, material choice, thickness, application processing, etc., can impact performance and robustness. Often, however, enhancing the properties in one of these two areas can be at the expense of the other. For example, increasing the thickness of a film or layers of films can often add robustness to the protective layer(s), but the increase can increase fluidic die temperature and thus reduce the maximum allowable firing frequency. Likewise, the use of a very thin protective film can provide faster firing frequencies in some instances, but often at the expense of reduced protective robustness.

Passivation films can be prepared as passivation stacks, using different types of materials in layers to promote thinner overall passivation structures, while providing adequate robustness for applications which are particularly harsh on thin film materials, such as can occur in fluidic dies. In accordance with this, a passivation stack can include a laminated film and a barrier film. The laminated film can include from 8 to 40 alternating layers of $HfO_2$ and $SiO_2$. The layers can individually have a thickness from 8 Angstroms to 40 Angstroms, and the laminated film can have a total thickness of 280 Angstroms to 600 Angstroms. The barrier film can be formed of $HfO_2$ and can have a thickness from 50 Angstroms to 300 Angstroms applied to the laminated film. In one example, the layers of $HfO_2$ and $SiO_2$ can individually have a thickness from 10 Angstroms to 20 Angstroms. In another example, the laminated film can have a thickness of 300 Angstroms to 500 Angstroms. Furthermore, in more specific detail, the passivation stack can have a total thickness (including both the laminated film and the barrier film thicknesses) from 450 Angstroms to 750 Angstroms. The passivation stack can be, for example, an Atomic Layer Deposition passivation stack that is free of pin-hole defects.

In another example, a fluidic die can include a substrate, a resistor positioned on the substrate, and a passivation stack positioned on the resistor. The passivation stack can include a laminated film, including from 8 to 40 alternating layers of $HfO_2$ and $SiO_2$. The layers can individually have a thickness from 8 Angstroms to 40 Angstroms, and the laminated film has a total thickness of 280 Angstroms to 600 Angstroms. The barrier film can be formed of $HfO_2$ and can have a thickness from 50 Angstroms to 300 Angstroms and can be applied to the laminated film. In further detail, conductors can be positioned on the substrate and electrically coupled with the resistor. In one example, the conductors can also have the passivation stack applied to a top surface thereof. The layers of $HfO_2$ and $SiO_2$ can individually have a thickness from 10 Angstroms to 20 Angstroms, and the laminated film can have a thickness of 300 Angstroms to 500 Angstroms. In another example, the passivation stack can have a total thickness from 450 Angstroms to 750 Angstroms. The passivation stack can, in one example, include a cavitation layer positioned on the passivation stack. In further detail, the passivation stack can be an Atomic Layer Deposition (ALD) passivation stack that is free of pin-hole defects.

In another example, a method of manufacturing a fluidic die can include building up a laminated film on a resistor using Atomic Layer Deposition and applying a barrier film of $HfO_2$ having a thickness from 50 Angstroms to 300 Angstroms to the laminated film. The laminated film can include from 8 to 40 alternating layers of $HfO_2$ and $SiO_2$ with individual layers having a thickness from 8 Angstroms to 40 Angstroms, and the laminated film can have a total thickness of 280 Angstroms to 600 Angstroms. In one example, conductors can be included that are in electrical communication with the resistor. In this example, building up the laminated film can include a continuous laminated film applied to both the conductors and the resistor. In further detail, the method can further include applying a cavitation layer to the barrier film (of the passivation stack), for example.

It is noted that when discussing the passivation stack, the fluidic die, or the method, these various discussions can be considered applicable to other examples whether or not they are explicitly discussed in the context of that example. Thus, for example, in discussing a barrier film in relation to the passivation stack, such disclosure is also relevant to and directly supported in context of the fluidic die, the method of printing, etc., and vice versa.

Turning now to FIG. 1, a passivation stack 150 can include a laminated film 152, including alternating layers of $HfO_2$ (Material A) and $SiO_2$ (Material B). The layers in the laminated film can individually have a thickness from 8 Angstroms to 40 Angstroms, or from 10 Angstroms to 20 Angstroms, for example. The laminated film can have a total thickness of 280 Angstroms to 600 Angstroms, or from 300 Angstroms to 500 Angstroms, as another example. In this example, the $HfO_2$ can provide robustness to the laminated film (and to the barrier film 154 if used in the barrier film) and the $SiO_2$ can provide desirable dielectric properties. In further detail, the passivation stack 150 can also include a barrier film 154 (Material A), having a thickness from 50 Angstroms to 300 Angstroms, or from 100 Angstroms to 250 Angstroms, for example, applied to the laminated film. The barrier film can also be prepared from $HfO_2$, which can provide further robustness to the passivation stack while staying within the thickness profile for the barrier film.

Once formed, the passivation stack can have a total thickness represented by the sum of the respective bottom ends and top ends of thickness ranges for the laminated film and the barrier film, e.g., from 330 Angstroms to 900 Angstroms. In a more specific example, however, the passivation stack can have a thickness from 450 Angstroms to 750 Angstroms, or from 500 Angstroms to 700 Angstroms, which can be considerably thinner than some other types of passivation layers used for fluidic dies, while often providing a similar level or even an increased level robustness. For example, a comparative passivation layer might include a first layer of SiC at about 500 Angstroms and a second layer of SiN at about 900 Angstroms for a total of about 1400 Angstrom, which can be similarly positioned on a resistor and conductors using Plasma Enhanced Chemical Vapor Deposition (PECVD). Compared to the passivation stacks of the present disclosure, this thicker passivation dual-layered film can be acceptable with respect to robustness and efficiency. However, compared to reduction in thickness obtained by the passivation stacks of the present disclosure while retaining acceptable robustness, one or more of several performance features can be positively impacted, e.g., increased power efficiency, enhanced functionality, increased fluidic die reliability, increased firing frequency, reduced operating temperature, etc. It is noted, however, that layered passivation film of SiC/SiN, for example, could be applied more thinly than 1400 Angstroms, and there are other materials that could likewise be applied more thinly. However, as an example using the SiC/SiN passivation film for illustration, this particular set of materials can be subject to pin-hole defects, and in some cases, coverage limitations can occur due to the step-wise construction of certain fluidic dies. Thus, simply making a material "thinner" is not just a matter of deciding to decrease the passivation thickness. Other considerations may also be evaluated, including providing reasonable robustness to physical stress and chemical attack, providing electrical properties and robustness suitable for use with a 40V (or other similar voltage) fluidic die, such as thermal inkjet printhead, etc.

The passivation stacks of the present disclosure can be prepared within a thickness range that is considered to be low in the inkjet printing industry, and at the same time, can provide acceptable robustness and can work well with 40V inkjet printheads, for example. In accordance with this, the passivation stacks of the present disclosure can be prepared using "Atomic Layer Deposition" or "ALD," which is a process that applies material to a substrate or a previously applied layer and is often considered a more specific subclass of chemical vapor deposition. ALD can include the sequential use of a fluid chemical or precursor, such as $HfCl_4$, $HfI_4$, TEMA-Hf, or TDMA-Hf for application of the $HfO_2$ laminate layers or the barrier layer. Precursor materials such as BTBAS, BDEAS, or TDMAS can be used for application of the $SiO_2$ laminate layers. Other precursor material can likewise be used for application of the $HfO_2$ or the $SiO_2$ layers, for example. These materials can be used to react sequentially with the deposition surface of a material one molecular layer at a time in a self-limiting manner. The deposition surface can be another type of layer, e.g., substrate, electrically insulative layer, thermally resistive layer, etc., or a previously applied layer of the passivation stack. In accordance with examples of the present disclosure, this process can be repeated using the same precursor gas to build up a film of a common material, e.g., $HfO_2$ of a target thickness, e.g., from 8 Angstroms to 40 Angstroms, and then a different precursor gas can be used to form a second common material layer, e.g. $SiO_2$, of a second target thickness, e.g., from 8 Angstroms to 40 Angstroms, and so forth. Once from 8 to 40 layers of $HfO_2$ and $SiO_2$ are formed, as shown by example in FIG. 1, the laminated film 152 can be considered to be formed. Likewise, the barrier film 154 having a thickness from 50 Angstroms to 300 Angstroms can be formed layer by layer using ALD and using an appropriate precursor gas. With the use of ALD, chemical robustness can be achieved that can be free of pin-holes, and thus can be applied much more thinly with acceptable robustness, while providing the added benefit of improved efficiency, cooler operating temperatures, and/or higher firing frequencies. In other words, the passivation stacks of the present disclosure can be applied, in some examples, just thick enough to provide adequate robustness, and because this level of robust thickness is considerably thinner than with other types of materials, the efficiency of the film can be passed on to enhance performance. That being stated, adding thickness levels beyond what may be merely adequate for robustness can also be implemented, with thicker passivation stacks still outperforming the 1400 Angstrom passivation layer mentioned by way of example above. In one example, the passivation stacks prepared in accordance with the present disclosure can have higher dielectric strength than many other materials, including SiC/SiN dual-layered passivation films, can be made to be pinhole free, and/or can be applied with excellent step coverage and chemical robustness.

Figure 2:
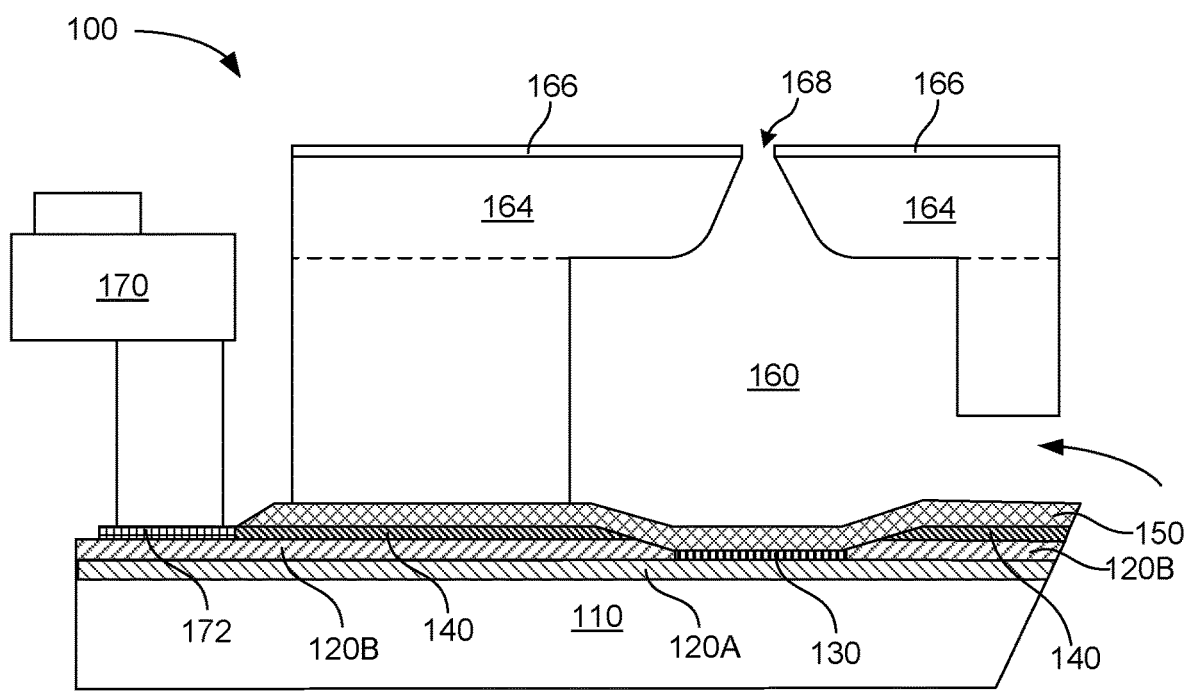
FIG. 2 depicts an example fluidic die with a passivation stack prepared in accordance with the present disclosure.

Turning now to FIG. 2, an example fluidic die 100 is shown, which includes the passivation stack 150 described in detail in FIG. 1. Notably, due to the scale of FIG. 2, the individual layers of the laminated film are not shown, nor is a separate barrier film shown, as these various layers are shown in adequate detail in FIG. 1. Thus, the passivation stack in this FIG. 2 (and FIG. 3 hereinafter) will be described as the passivation stack, with the understanding that the passivation stack can include the details as shown and described in FIG. 1. The fluidic die 100 of FIG. 2 can further include, for example, a substrate 110, which in this instance can be a silicon wafer or some other substrate suitable for application of the various layers that can be present as part of a fluidic die or another type of semiconductor device. One example of a fluidic die is a printhead. Fluidic dies can also be used in lab-on-a-chip devices, precision dispensing devices, etc.

The substrate, for example, can be electrically and/or thermally insulated. In this particular example, an electrically insulating layer 120A can also be included that is positioned on the substrate. The terms "positioned on" or "applied to" do not infer that a specific layer is positioned directly on the previous layer, as there may in some instances be an intervening layer. For example, conductors may be said to be positioned on or deposited to an electrically insulating layer, but there may also be a thermal resistance layer 120B positioned therebetween. Some flexibility in this regard is thus considered with the scope of the present disclosure. That being stated, in some examples, there may be fluidic dies that include the electrically insulating layer, but there may or may not be a separate thermal resistance layer. If both are present, these two layers can be of the same material, or can be of different materials. For example, one or both layers can be a Plasma Enhanced Chemical Vapor Deposition (PECVD) silicon oxide, such as tetraethylorthosilicate (TEO) PECVD silicon oxide. The thickness of one or both layers can independently be from 1 µm to 10 µm, from 1 µm to 5 µm, or from 1.5 µm to 3 µm, for example.

Additionally, a resistor 130 (sometimes referred to as a "firing resistor") is also shown that is positioned on the substrate 110. Example materials that can be used to form the resistor include TaAl, WSiN, or TaSiN. A suitable average thickness for the resistor can be from 200 Angstroms to 5,000 Angstroms, or 500 Angstroms to 2,000 Angstroms, for example. Furthermore, the resistor, as described, can be doped with any material suitable for achieving desired electrical properties, including, but not limited to, resistivity. The resistor can be in electrical communication with a pair of conductors 140 positioned adjacent to and in electrical communication with the resistor to facilitate application of an electrical potential across the resistor. These conductors can act as electrodes for the resistor, e.g., a pair of electrodes on either side or otherwise positioned to apply a voltage across the resistor. In this example, the conductors can be positioned on the thermal resistor layer, though this arrangement is merely exemplary. The conductors can be of any material that can conduct electricity sufficient to cause the resistor to operate as expected in the context of a fluidic die, such as an inkjet printhead, e.g., to cause fluid ejection from a firing chamber 160 through a nozzle 168 defined by an orifice plate 164. The orifice plate may or may not include a protective coating 166, such as a thin film membrane or chemical coating. The conductors, for example, can include copper, aluminum, silver, gold, or an alloy thereof.

As shown, the passivation stack 150 can be applied to the resistor 130, but can also be applied to the conductors 140, such as at locations that define an interior surface of the firing chamber 160. Thus, the passivation stack can not only protect the resistor from chemical attach and other harsh environmental conditions, it can also act to protect the conductors. The conductors can be in electrical contact with a bonding pad 172, which is a location where an electrical interconnect 170 can electrically communicate with conductors (through the bonding pad). The electrical interconnect can be electrically coupled to circuitry, hardware, software, etc. (not shown), which can act to control the fluidic die.

FIG. 3 depicts an alternative example, illustrating an alternative structure of a portion of the fluidic die structure shown in FIG. 2. Furthermore, in this example, the substrate 110 includes the electrically insulating layer 120A applied thereto but does not include a separate thermally resistive layer. In this example, the resistor 130 and the conductors 140 are positioned on the insulating layer, and the passivation stack 150 is applied to the resistor and the conductors, by way of example. Notably, the conductors in this example can include a pair of electrodes. In further detail, a cavitation layer 180 can also be present. As a note, this additional layer is provided by way of example only and may or may not be present. In one example, the cavitation layer can provide protection to the fluidic die, as well as provide a conductive surface when the cavitation is metal, for example, e.g., in contact with the ink contained in the firing chamber, to contribute to grounding the circuit. This cavitation layer can be applied relatively thinly to retain some of the efficiency gains provided by the use of the passivation stack 150 described herein. For example, if present, the cavitation layer can be from 20 angstroms to 500 angstroms, from 8 angstroms to 400 angstroms, from 8 angstroms to 300 angstroms, from 8 angstroms to 200 angstroms, from 8 angstroms to 100 angstroms, from 8 angstroms to 40 angstroms, etc. If a metal cavitation layer is used, the metal can be an elemental metal, alloy of metals, alloy of metal(s) and metalloid(s), etc. The metals can be one or more of Group IV, V, VI, IX, or X (4, 5, 6, 9, or 10) metals, and can include metals such as titanium, vanadium, chromium, zirconium, niobium, molybdenum, rhodium, hafnium, tantalum, tungsten, and iridium. The metalloid, if present, can be silicon, carbon, or boron, for example. In one aspect, tantalum (Ta) can be included in a top protective coating layer, if present, as it can be chemically resistant to many inks and also can resist mechanical cavitation forces from bubble collapse. Tantalum, as applied, can typically be in the crystalline form. In other examples, however, the metal protective layer can be an amorphous metal layer, such as an amorphous metal, metal alloy, or metal/metalloid alloy, etc., which can also be heat and chemical resistant. If an alloy, a two, three, or four component mixtures of elements can be blended in a manner and in quantities that the mixture is homogenous when positioned on the substrate. Additionally, the mixture can be positioned on a suitable substrate using any of a number of deposition techniques, as mentioned. With amorphous coatings, particularly metal alloys with three or even four metals, using different sized metals (at the atomic level) can create "confusion" of sizes which may disfavor the formation of a lattice structure. This atomic dispersity between components can contribute to thermal stability, oxidative stability, chemical stability, surface smoothness, etc. Regardless, the thin metal film can be positioned on the passivation stack, and more particularly to the barrier film of the passivation stack in accordance with certain specific examples of the present disclosure.

In accordance with the various examples shown in FIGS. 1-3, it is noted that $HfO_2$ can provide robustness to the laminated film and the $SiO_2$ can provide acceptable dielectric properties to the laminated film. As an example, the dielectric constant of $HfO_2$ can be about 4 to 6 times higher than that of $SiO_2$, depending on the application method, microstructure, and/or compositional components that may be present, e.g., dopant, impurities, etc. Thus, these two materials can provide a good balance between providing robustness and dielectric properties, such as for use with a fluidic die, which can be an inkjet printhead that may be subjected to high frequencies and relatively high voltages, e.g., 10 kHz or more or 20 kHz or more and/or up to 40 V or more in some instances. For example, there may be printheads that have a target frequency response of 15 kHz (or more), and a target operational voltage of about 35 V (or more) for application to the firing resistor, which may be engineered to consistently withstand up to 40 V or even up to 60 V. This can provide voltage cushion between typical operating voltages and as well as a margin voltage increases that may occur during various operational conditions. For example, the passivation stack of the present disclosure can be prepared to withstand 40 V of electrical potential applied across the resistor, with an ink-filled chamber acting as a ground for the electrical circuit (see FIG. 2 with no additional cavitation layer shown), or with the ink-filled chamber and the cavitation layer acting together as a ground for the electrical circuit (see FIG. 3 which includes a cavitation layer). Thus, in accordance with examples of the present disclosure, the passivation stacks, in one example, can be prepared to withstand (electrically separate) a 40 V potential applied to the resistor relative to the ground. To evaluate whether or not the passivation stack works well for a given voltage, DC conditions can be used to evaluate electrical performance. For example, a test voltage, e.g., 40 V, 50 V, 60 V, etc. can be applied across the passivation stack (like a capacitor with the passivation stack providing the spacing) and current leakage at or below 1 $\mu A/\mu m^2$ (microamps/square micrometer) would be considered as passing in one example. Thus, the passivation stack can be quantified using a voltage minimum value relative to a passivation stack thickness in Angstroms, meaning that at a specific thickness (or greater), the passivation stack has a minimum voltage that it can withstand allowing for only 1 $\mu A/\mu m^2$ of current leakage. Thus, in one example, the passivation stack can be rated at 40 V for 330 Angstroms of thickness, 40 V at 450 Angstroms, 40 V at 600 Angstroms, 40 V at 800 Angstroms, 60 Volts at 400 Angstroms, 60 V at 600 Angstroms, 60 V at 800 Angstroms, etc. Higher voltages paired with lower the thicknesses can indicate a more electrically robust material for purposes of passivation properties, for example.

In FIG. 4, a method 200 manufacturing a fluidic die is also described, which can include building up 210 a laminated film on a resistor using Atomic Layer Deposition. The laminated film can include from 8 to 40 alternating layers of $HfO_2$ and $SiO_2$ with individual layers having a thickness from 8 Angstroms to 40 Angstroms. The laminated film can have a total thickness of 280 Angstroms to 600 Angstroms. The method can also include applying 220 an $HfO_2$ barrier film having a thickness from 50 Angstroms to 300 Angstroms to the laminated film. This method can be carried out to prepare any of the structures described herein by example, as well as any other similar structures used to prepare fluidic dies, such as thermal inkjet printheads, in accordance with the present disclosure. For example, conductors can be included that are in electrical communication with the resistor. In this example, building up the laminated film can include a continuous laminated film applied to both the conductors and the resistor.

It is noted that, as used in this specification and the appended claims, the singular forms "a," "an," and "the" include plural referents unless the context clearly dictates otherwise.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 at % to about 5 at %" should be interpreted to include not only the explicitly recited values of about 1 at % to about 5 at %, but also to include individual values and sub-ranges within the indicated range. Thus, included in this numerical range are individual values such as 2, 3.5, and 4 and sub-ranges such as from 1-3, from 2-4, and from 3-5, etc. This same principle applies to ranges reciting only one numerical value. Furthermore, such an interpretation should apply regardless of the breadth of the range or the characteristics being described.

The following example illustrates aspects of the passivation stack as presently known. Thus, this example should not be considered as limiting, but rather as an example describing aspects of the present disclosure.

EXAMPLE

Figure 5:
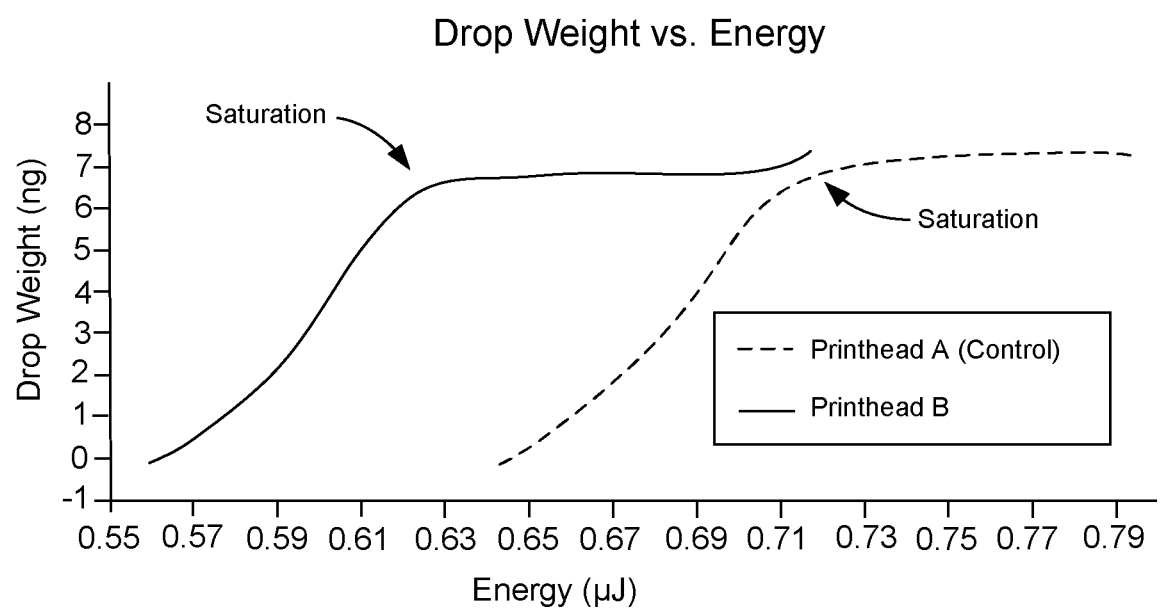
FIG. 5 is a graph depicting drop weight output vs. total energy, which compares an example printhead to a comparative printhead in accordance with the present disclosure.

Two different fluidic dies in the form of thermal inkjet printheads were compared to establish the minimal amount of energy that could be used to achieve drop weight "printhead saturation." Print head saturation can be determined by applying increasing levels of energy to a printhead and recording the drop weight increase that occurs as the energy is increased, using the same thermal inkjet printhead. At some point, regardless of increased energy, the drop weight increase levels off. This can be used to establish the minimum energy level that can be applied to a printhead to achieve essentially the maximum drop weight that a printhead can handle within established testing parameters. An example of two different curves comparing drop weight (ng) to input energy ($\mu J$) is shown by way of example in FIG. 5, with the printhead saturation point shown thereon.

In more specific detail, the two inkjet printheads that were compared had a structure similar to that shown in FIG. 2, and included an insulated silicon substrate, a TEOS PECVD silicon oxide insulative layer, a WSiN resistor, an aluminum copper alloy pair of conductors, and a tantalum cavitation layer over the passivation film, and a printhead nozzle having a 20 $\mu m$ diameter. Two different passivation films were applied to the two separate structures for comparison purposes. More specifically, the control passivation film (used in Printhead A) included two layers, namely a first layer of SiC at 900 Angstroms in thickness and a second layer of SiN at 500 Angstroms. The control passivation film was prepared using PECVD (sometimes also prepared using an ALD/PECVD hybrid deposition process). The second passivation film (used in Printhead B) was a passivation stack prepared in accordance with the present disclosure and structured according to that shown by example in FIG. 1. More specifically, the passivation stack was 600 Angstroms in total thickness, with 400 Angstroms being provided by the laminated stack (10 layers of H $HfO_2$ alternating with 10 layers of $SiO_2$, e.g., 20 alternating layers; Individual layers each at 10 Angstroms), and 200 Angstroms being provided by an $HfO_2$ barrier layer. The passivation stack was prepared by an ALD process.

Both printheads, Printhead A (control) and Printhead B (with passivation stack) were evaluated to determine the minimum energy level that could be used to achieve drop weight saturation, as described above. The inkjet ink used for the comparison was an aqueous inkjet ink with a viscosity of about 4 cps to 6 cps. Printhead A reached saturation at a region around 6 to 7 nanograms (ng) in drop weight at an energy input of about 0.71 to 0.73 millijoules (pJ). Conversely, Printhead B reached saturation at a region also around 6 to 7 ng at an energy input of about 0.62 to 0.63 $\mu J$. Thus, the total energy input for Printhead B was about 13% to 15% lower to achieve the same saturation performance compared to Printhead A. This difference in energy input can translate to performance improvements such as one or more of reduced nozzle current, reduced turn-on voltage, reduced maximum temperature, increased firing frequency, and/or lower operating temperatures. For example, and without limitation, where Printhead A may be capable of a firing frequency of 10 kHz at an operating temperature from 65° C. to 80° C., Printhead B may be able to fire at 20 kHz at the same operating temperature. In support of this, preliminary evaluations have indicated that the frequency can be increased two- to three-fold at the same operating temperature using Printhead B compared to Printhead A.

In further detail, the passivation stack of Printhead A was tested at 60 V of DC current and was found to have less than 1 $\mu A/\mu m^2$ of current leakage, indicating that this 600 Angstrom film was more than adequate to operate at expected 35 V AC current during normal use in a thermal inkjet printhead.

While the disclosure has been described with reference to certain embodiments, those skilled in the art will appreciate that various modifications, changes, omissions, and substitutions can be made without departing from the spirit of the disclosure. It is intended, therefore, that the disclosure be limited only by the scope of the following claims.

What is claimed is:

1. A passivation stack, comprising:
    a laminated film, including from 8 to 40 alternating layers of $HfO_2$ and $SiO_2$, wherein the layers individually have a thickness from 8 Angstroms to 40 Angstroms, and wherein the laminated film has a total thickness of 280 Angstroms to 600 Angstroms; and
    a barrier film of $HfO_2$ having a thickness from 50 Angstroms to 300 Angstroms applied to the laminated film.

2. The passivation stack of claim 1, wherein the layers of $HfO_2$ and $SiO_2$ individually have a thickness from 10 Angstroms to 20 Angstroms.

3. The passivation stack of claim 1, wherein the laminated film has a thickness of 300 Angstroms to 500 Angstroms.

4. The passivation stack of claim 1, wherein the passivation stack has a total thickness, including both the laminated film and the barrier film thicknesses, from 450 Angstroms to 750 Angstroms.

5. The passivation stack of claim 1, wherein the passivation stack is an Atomic Layer Deposition passivation stack that is free of pin-hole defects.

6. A fluidic die, comprising:
    a substrate;
    a resistor positioned on the substrate; an
    a passivation stack positioned on resistor, the passivation stack, comprising:
        a laminated film, including from 8 to 40 alternating layers of $HfO_2$ and $SiO_2$, wherein the layers individually have a thickness from 8 Angstroms to 40 Angstroms, and wherein the laminated film has a total thickness of 280 Angstroms to 600 Angstroms; and
        a barrier film of $HfO_2$ having a thickness from 50 Angstroms to 300 Angstroms applied to the laminated film.

7. The fluidic die of claim 6, further comprising conductors electrically coupled with the resistor.

8. The fluidic die of claim 7, wherein the passivation stack is also applied to a top surface of the conductors.

9. The fluidic die of claim 6, wherein the layers of $HfO_2$ and $SiO_2$ individually have a thickness from 10 Angstroms to 20 Angstroms, and the laminated film has a thickness of 300 Angstroms to 500 Angstroms.

10. The fluidic die of claim 6, wherein the passivation stack has a total thickness from 450 Angstroms to 750 Angstroms.

11. The fluidic die of claim 6, further comprising a cavitation layer positioned on the passivation stack.

12. The fluidic die of claim 6, wherein the passivation stack is an Atomic Layer Deposition passivation stack that is free of pin-hole defects.

13. A method of manufacturing a fluidic die, comprising:
    building up a laminated film on a resistor using Atomic Layer Deposition, wherein the laminated film includes from 8 to 40 alternating layers of $HfO_2$ and $SiO_2$ with individual layers having a thickness from 8 Angstroms to 40 Angstroms, and wherein the laminated film has a total thickness of 280 Angstroms to 600 Angstroms; and
    applying a barrier film of $HfO_2$ having a thickness from 50 Angstroms to 300 Angstroms to the laminated film.

14. The method of claim 13, wherein conductors are in electrical communication with the resistor, and wherein building up also includes building up the laminated film on the conductors as a continuous laminated film applied to both the conductors and the resistor.

15. The method of claim 13, further comprising applying a cavitation layer to the barrier film.

* * * * *